United States Patent
Hong et al.

(10) Patent No.: US 12,114,567 B2
(45) Date of Patent: Oct. 8, 2024

(54) PHOTOELECTRIC DEVICES HAVING CHARGE TRANSPORT LAYER INCLUDING FIRST CHARGE TRANSPORT MATERIAL AND SECOND CHARGE TRANSPORT MATERIAL AND SENSORS AND ELECTRONIC DEVICES

(71) Applicant: Samsung Electronics Co., Ltd., Suwon-si (KR)

(72) Inventors: Seok-Hwan Hong, Seoul (KR); Sung Jun Park, Yongin-si (KR); Kyung Bae Park, Hwaseong-si (KR); Sung Young Yun, Suwon-si (KR); Chul Joon Heo, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/150,888

(22) Filed: Jan. 6, 2023

(65) Prior Publication Data

US 2023/0157167 A1    May 18, 2023

Related U.S. Application Data

(63) Continuation of application No. 16/887,405, filed on May 29, 2020, now Pat. No. 11,563,186.

(30) Foreign Application Priority Data

Nov. 1, 2019  (KR) .......................... 10-2019-0138740
Apr. 14, 2020  (KR) .......................... 10-2020-0045432

(51) Int. Cl.
*H01L 29/08*    (2006.01)
*H10K 85/40*    (2023.01)
(Continued)

(52) U.S. Cl.
CPC ......... *H10K 85/6572* (2023.02); *H10K 85/40* (2023.02); *H10K 85/615* (2023.02);
(Continued)

(58) Field of Classification Search
CPC ............. H10K 85/6572; H10K 85/654; H10K 85/6574; H10K 85/615; H10K 85/626; H10K 85/40; H10K 39/32; H10K 30/30
(Continued)

(56) References Cited

U.S. PATENT DOCUMENTS 4,299,897 A    11/1981    Stolka et al.
9,431,621 B2   8/2016     Forrest et al.
(Continued)

FOREIGN PATENT DOCUMENTS

CN    104718638 A  *  6/2015   ......... H01L 33/0041
CN    112086562 A  * 12/2020   ......... H01L 51/0001
(Continued)

OTHER PUBLICATIONS

Korean Office Action dated Jul. 10, 2024 of the corresponding Korean Patent Application No. 10-2020-0045432 and English translation thereof.
(Continued)

*Primary Examiner* — Phuc T Dang
(74) *Attorney, Agent, or Firm* — Harness, Dickey & Pierce, P.L.C.

(57) ABSTRACT

A photoelectric device includes a first electrode, a second electrode, a photoelectric conversion layer between the first electrode and the second electrode, and a charge transport layer between the first electrode and the photoelectric conversion layer. The photoelectric conversion layer is configured to absorb light in a wavelength spectrum and converting the absorbed light into an electrical signal. The charge transport layer includes a first charge transport material and
(Continued)

a second charge transport material which collectively define a heterojunction.

20 Claims, 14 Drawing Sheets

(51) Int. Cl.
    *H10K 85/60*     (2023.01)
    *H10K 30/30*     (2023.01)
    *H10K 39/32*     (2023.01)

(52) U.S. Cl.
    CPC ......... *H10K 85/626* (2023.02); *H10K 85/654* (2023.02); *H10K 85/6574* (2023.02); *H10K 30/30* (2023.02); *H10K 39/32* (2023.02)

(58) Field of Classification Search
    USPC .......................................................... 257/40
    See application file for complete search history.

(56) References Cited

U.S. PATENT DOCUMENTS

| | | |
|---|---|---|
| 10,032,983 B2 | 7/2018 | Chen et al. |
| 10,043,993 B2 * | 8/2018 | Arango ................. H10K 30/35 |
| 2008/0125608 A1 * | 5/2008 | Bender ................. C07C 209/10 |
| | | 564/405 |
| 2009/0208776 A1 | 8/2009 | Liu et al. |
| 2012/0319090 A1 | 12/2012 | Shinkai et al. |
| 2016/0181547 A1 * | 6/2016 | Han ..................... H10K 85/211 |
| | | 257/40 |
| 2017/0148994 A1 | 5/2017 | Choi et al. |
| 2017/0277048 A1 | 9/2017 | Maki et al. |
| 2019/0330074 A1 * | 10/2019 | Tang ..................... H01L 33/502 |

FOREIGN PATENT DOCUMENTS

| | | |
|---|---|---|
| KR | 10-2017-0131193 A | 11/2017 |
| KR | 10-2019-0079343 A | 7/2019 |

OTHER PUBLICATIONS

Lee, W. et al., "High performance polymer solar cells employing a low-temperature solution-processed organic-inorganic hybrid electron transport layer," Journal of Materials Chemistry A, Sep. 27, 2016, vol. 4, p. 16612-16618.

* cited by examiner

PHOTOELECTRIC DEVICES HAVING CHARGE TRANSPORT LAYER INCLUDING FIRST CHARGE TRANSPORT MATERIAL AND SECOND CHARGE TRANSPORT MATERIAL AND SENSORS AND ELECTRONIC DEVICES

CROSS-REFERENCE TO RELATED APPLICATIONS

This application is a continuation of U.S. application Ser. No. 16/887,405, filed May 29, 2020, U.S. Pat. No. 11,563,186, which claims priority to and the benefit of Korean Patent Application No. 10-2019-0138740 filed in the Korean Intellectual Property Office on Nov. 1, 2019, and Korean Patent Application No. 10-2020-0045432 filed in the Korean Intellectual Property Office on Apr. 14, 2020, the entire contents of each of which are incorporated herein by reference.

BACKGROUND

1. Field

Photoelectric devices, sensors, and electronic devices are disclosed.

2. Description of the Related Art

A photoelectric device receives light and converts light into an electrical signal. It may include a photodiode, a phototransistor, and the like, and may be applied to (e.g., included in) an image sensor, a solar cell, and the like.

Sensors are required to have higher resolutions, resulting in smaller pixel sizes. In the case of a silicon photodiode which is mainly used now, sensitivity of a sensor including the photodiode may be deteriorated because sizes of the pixels of the sensor become smaller and the absorption areas are reduced.

SUMMARY

According to some example embodiments, an organic material may have a high extinction coefficient and configured to selectively absorb light in a particular wavelength region depending on a molecular structure, and thus may simultaneously replace a photodiode and a color filter and resultantly improve sensitivity and contribute to high integration.

Some example embodiments provide a photoelectric device capable of improving charge extraction efficiency. The photoelectric device may include the organic material.

Some example embodiments provide a sensor including the photoelectric device.

Some example embodiments provide an electronic device including the photoelectric device or the sensor.

According to some example embodiments, a photoelectric device may include a first electrode, a second electrode, a photoelectric conversion layer between the first electrode and the second electrode, the photoelectric conversion layer configured to absorb light in a wavelength spectrum and convert the absorbed light into an electrical signal, and a charge transport layer between the first electrode and the photoelectric conversion layer, the charge transport layer including a first charge transport material and a second charge transport material which collectively define a heterojunction.

The charge transport layer may have positive charges at an interface of the first charge transport material and the second charge transport material.

A difference between an energy bandgap of the first charge transport material and an energy bandgap of the second charge transport material may be greater than about 0 eV and less than or equal to about 0.2 eV.

A difference between a Lowest Unoccupied Molecular Orbital (LUMO) energy level of the first charge transport material and a LUMO energy level of the second charge transport material may be less than or equal to about 0.05 eV.

The photoelectric conversion layer may include a p-type semiconductor and an n-type semiconductor which collectively define a pn junction. A difference between the LUMO energy level of the n-type semiconductor and the LUMO energy level of the first charge transport material may be greater than or equal to about 1.2 eV and a difference between the LUMO energy level of the n-type semiconductor and the LUMO energy level of the second charge transport material may be greater than or equal to about 1.2 eV.

Each material of the first charge transport material and the second charge transport material may be a non-absorbing material.

The first charge transport material and the second charge transport material may be organic materials having different structures, and the first charge transport material and the second charge transport material may have a same nitrogen-containing ring and a same cyano group.

The first charge transport material may be represented by Chemical Formula 1.

[Chemical Formula 1]

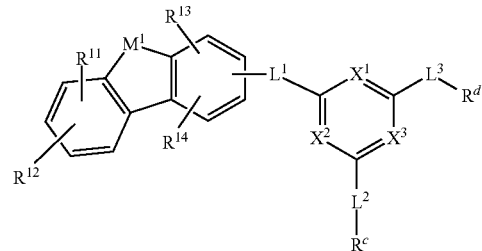

In Chemical Formula 1,
X$^1$ to X$^3$ are independently CR$^a$ or N,
at least two of X$^1$ to X$^3$ are N,
M$^1$ is O, S, Se, Te, or NR$^b$,
R$^a$ and R$^b$ are independently hydrogen, a substituted or unsubstituted C1 to C30 alkyl group, or a substituted or unsubstituted C6 to C30 aryl group,
R$^c$ and R$^d$ are a substituted or unsubstituted C6 to C30 aryl group, a substituted or unsubstituted C3 to C30 heterocyclic group, or a cyano group,
L$^1$ to L$^3$ are independently a single bond, a substituted or unsubstituted C1 to C6 alkylene group, a substituted or unsubstituted C6 to C30 arylene group, or a combination thereof, and
R$^{11}$ to R$^{14}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In Chemical Formula 1, $X^1$ to $X^3$ may independently be N, $M^1$ may be O or S, $L^1$ to $L^3$ may independently be a single bond or a substituted or unsubstituted C6 to C30 arylene group, $R^c$ and $R^d$ may be a substituted or unsubstituted C6 to C30 aryl group, or a cyano group, and $R^{11}$ to $R^{14}$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The second charge transport material may be represented by Chemical Formula 2.

[Chemical Formula 2]

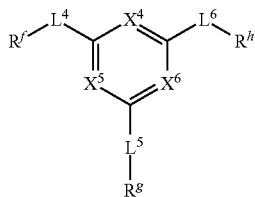

In Chemical Formula 2,
$X^4$ to $X^6$ are independently $CR^e$ or N,
at least two of $X^4$ to $X^6$ are N,
$R^e$ is hydrogen, a substituted or unsubstituted C1 to C30 alkyl group, or a substituted or unsubstituted C6 to C30 aryl group,
$R^f$ to $R^h$ are a substituted or unsubstituted C6 to C30 aryl group, a substituted or unsubstituted C3 to C30 heterocyclic group, or a cyano group, and
$L^4$ to $L^6$ are independently a single bond, a substituted or unsubstituted C1 to C6 alkylene group, a substituted or unsubstituted C6 to C30 arylene group, or a combination thereof.

In Chemical Formula 2, $X^4$ to $X^6$ may independently be N, $R^f$ to $R^h$ may be a substituted or unsubstituted C6 to C30 aryl group, a substituted or unsubstituted C3 to C30 heterocyclic group, or a cyano group, and $L^4$ to $L^6$ may independently be a single bond or a substituted or unsubstituted C6 to C30 arylene group.

The charge transport layer may have a thickness of less than or equal to about 10 nm.

The charge transport layer may include a first charge transport layer including the first charge transport material and a second charge transport layer including the second charge transport material.

The first charge transport layer and the second charge transport layer may be in contact with each other.

A LUMO energy level of the first charge transport material may be shallower than a LUMO energy level of the second charge transport material, and the first charge transport layer may be closer to the photoelectric conversion layer than the second charge transport layer.

The second charge transport layer may further include a third charge transport material different from the first charge transport material and the second charge transport material.

The third charge transport material may include lithium quinolate.

Each thickness of the first charge transport layer and the second charge transport layer may be less than or equal to about 5 nm.

According to some example embodiments, a photoelectric device may include a first electrode, a second electrode, a photoelectric conversion layer between the first electrode and the second electrode, the photoelectric conversion layer configured to absorb light in a wavelength spectrum and convert the absorbed light into an electrical signal, and a charge transport layer between the first electrode and the photoelectric conversion layer, the charge transport layer including a first charge transport material represented by Chemical Formula 1 and a second charge transport material represented by Chemical Formula 2.

[Chemical Formula 1]

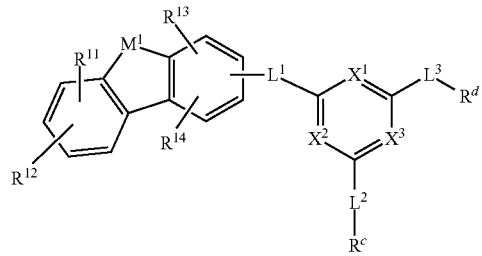

In Chemical Formula 1,
$X^1$ to $X^3$ are $CR^a$ or N,
at least two of $X^1$ to $X^3$ are N,
$M^1$ is O, S, Se, Te, or $NR^b$,
$R^a$ and $R^b$ are independently hydrogen, a substituted or unsubstituted C1 to C30 alkyl group, or a substituted or unsubstituted C6 to C30 aryl group,
$R^c$ and $R^d$ are a substituted or unsubstituted C6 to C30 aryl group,
$L^1$ to $L^3$ are independently a single bond, a substituted or unsubstituted C1 to C6 alkylene group, a substituted or unsubstituted C6 to C30 arylene group, or a combination thereof, and
$R^{11}$ to $R^{14}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group;

[Chemical Formula 2]

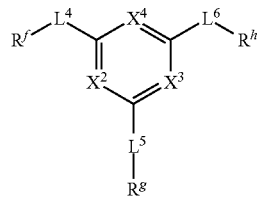

wherein, in Chemical Formula 2,
$X^1$ to $X^3$ are $CR^e$ or N,
at least two of $X^1$ to $X^3$ are N,
$R^e$ is hydrogen, a substituted or unsubstituted C1 to C30 alkyl group, or a substituted or unsubstituted C6 to C30 aryl group,
$R^f$ to $R^h$ are a substituted or unsubstituted C6 to C30 aryl group, and
$L^4$ to $L^6$ are independently a single bond, a substituted or unsubstituted C1 to C6 alkylene group, a substituted or unsubstituted C6 to C30 arylene group, or a combination thereof.

The charge transport layer may have a positive charge at an interface of the first charge transport material and the second charge transport material.

According to some example embodiments, a sensor including the photoelectric device is provided.

According to some example embodiments, an electronic device including the photoelectric device is provided.

According to some example embodiments, an electronic device including the sensor is provided.

Remaining charge carriers may be reduced to increase the charge extraction efficiency of the photoelectric device due to improved charge mobility.

DETAILED DESCRIPTION

Figure 1:
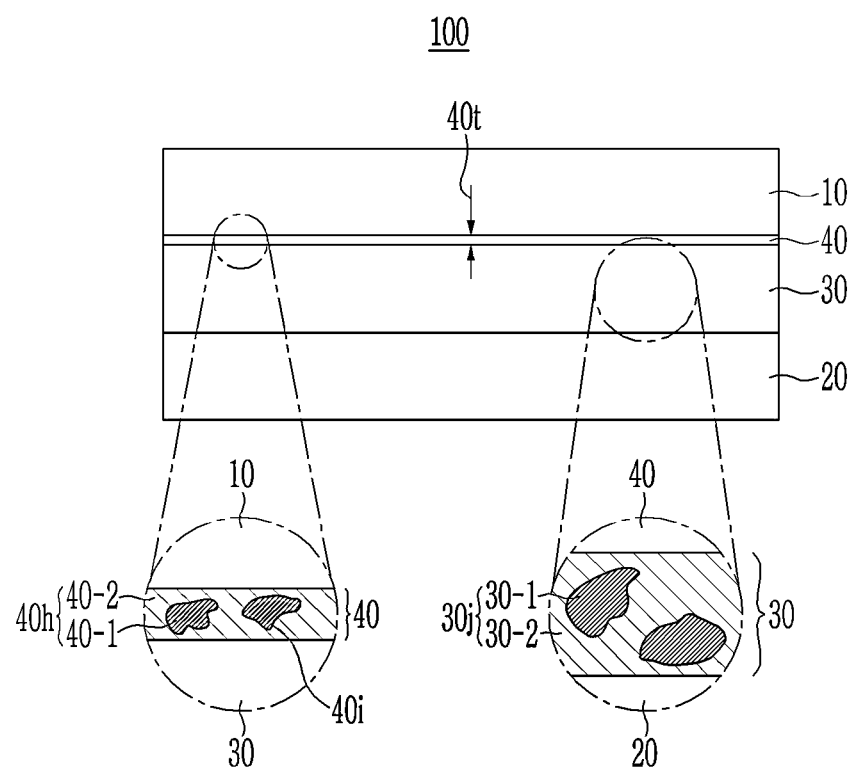
FIG. 1 is a cross-sectional view showing a photoelectric device according to some example embodiments.

Example embodiments will hereinafter be described in detail, and may be easily performed by a person skilled in the related art. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

When a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 4 heteroatoms selected from N, O, S, Se, Te, Si, and P.

Hereinafter, "combination" refers to a mixture or a stacked structure of two or more.

Hereinafter, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, the energy bandgap refers to a difference between the highest occupied molecular orbital (HOMO) energy level and the lowest unoccupied molecular orbital (LUMO) energy level.

Hereinafter, a photoelectric device according to some example embodiments is described.

FIG. 1 is a cross-sectional view showing a photoelectric device according to some example embodiments.

Referring to FIG. 1, the photoelectric device 100 according to some example embodiments includes a first electrode 10, a second electrode 20, a photoelectric conversion layer 30 between the first electrode 10 and the second electrode 20, and a charge transport layer 40.

A substrate (not shown) may be disposed at the side of (e.g., in contact with a surface of) the first electrode 10 or the second electrode 20. The substrate may be for example made of (e.g., may at least partially comprise) an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

One of the first electrode 10 or the second electrode 20 is an anode and the other is a cathode. In some example embodiments, the first electrode 10 may be a cathode and the second electrode 20 may be an anode.

At least one of the first electrode 10 or the second electrode 20 may be a transparent electrode. Herein, the transparent electrode may be a transparent electrode having a high light transmittance of greater than or equal to about 80%.

The transparent electrode may include for example at least one of an oxide conductor, a carbon conductor, or a metal thin film. The oxide conductor may include for example at least one of indium tin oxide (ITO), indium zinc oxide (IZO), zinc tin oxide (ZTO), aluminum tin oxide (AlTO), or aluminum zinc oxide (AZO), the carbon conductor may at least one of graphene or carbon nanostructures, and the metal thin film may be a very thin film including aluminum, magnesium silver, gold, an alloy thereof, or a combination thereof.

One of the first electrode 10 or the second electrode 20 may be a reflective electrode. Herein, the reflective electrode may be, in some example embodiments, a reflective electrode having of a light transmittance of less than about 10% or high reflectance of greater than or equal to about 5%. The reflective electrode may include a reflective conductor such as a metal and may include, for example aluminum (Al), silver (Ag), gold (Au), or an alloy thereof.

In some example embodiments, the first electrode 10 may be a transparent electrode having a light transmittance of greater than or equal to about 80% or a reflective electrode having a light transmittance of less than about 10%.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The photoelectric conversion layer 30 may absorb light in at least one part in a wavelength region (e.g., in a wavelength spectrum) and may convert the absorbed light into an electric signal, and for example one of light in a green wavelength region (hereinafter, referred to as "green light"), light in a blue wavelength region (hereinafter, referred to as "blue light"), light in a red wavelength region (hereinafter, referred to as "red light"), or light in an infrared wavelength region (hereinafter, referred to as "infrared light") into an electric signal.

In some example embodiments, the photoelectric conversion layer 30 may be configured to selectively absorb at least one of the green light, the blue light, the red light, or the infrared light. Herein, the selective absorption of at least one from the green light, the blue light, the red light, or the infrared light means that a light-absorption spectrum has a peak absorption wavelength (λmax) in one of about 500 nm to about 600 nm, greater than or equal to about 380 nm and less than about 500 nm, greater than about 600 nm and less than or equal to about 700 nm, or greater than about 700 nm, and a light-absorption spectrum in the corresponding wavelength region is remarkably higher than those in the other wavelength regions.

The photoelectric conversion layer 30 may include at least one p-type semiconductor 30-1 and at least one n-type semiconductor 30-2 which collectively form (e.g., define) a pn junction 30j and may produce excitons by receiving light from outside and then separate the produced excitons into holes and electrons.

The p-type semiconductor 30-1 and the n-type semiconductor 30-2 may be independently light-absorbing materials, and for example at least one of the p-type semiconductor 30-1 or the n-type semiconductor 30-2 may be an organic light-absorbing material. In some example embodiments, at least one of the p-type semiconductor 30-1 or the n-type semiconductor 30-2 may be a wavelength-selective light-absorbing material that selectively absorbs light in a predetermined wavelength region, and for example at least one of the p-type semiconductor 30-1 or the n-type semiconductor 30-2 may be a wavelength-selective organic light-absorbing material. The p-type semiconductor 30-1 and the n-type semiconductor 30-2 may have a peak absorption wavelength (λmax) in the same wavelength region or in a different wavelength region.

In some example embodiments, the p-type semiconductor 30-1 may be an organic material having a core structure including an electron donating moiety, a pi conjugation linking group, and an electron accepting moiety.

The p-type semiconductor 30-1 may be for example represented by Chemical Formula A, but is not limited thereto.

EDG-HA-EAG    [Chemical Formula A]

In Chemical Formula A,

HA is a C2 to C30 heterocyclic group having at least one of S, Se, Te, and Si,

EDG is an electron-donating group, and

EAG is an electron accepting group.

In some example embodiments, the p-type semiconductor 30-1 represented by Chemical Formula A may be for example represented by Chemical Formula A-1.

[Chemical Formula A-1]

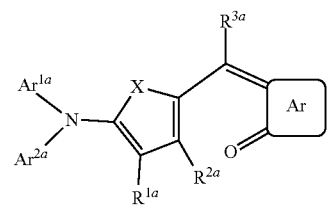

In Chemical Formula A-1,

X may be O, S, Se, Te, SO, SO$_2$, or SiR$^a$R$^b$,

Ar may be a substituted or unsubstituted C6 to C30 arylene group, a substituted or unsubstituted C3 to C30 heterocyclic group, or a fused ring of the foregoing two or more, Ar$^{1a}$ and Ar$^{2a}$ may independently be a substituted or unsubstituted C6 to C30 aryl group or a substituted or unsubstituted C3 to C30 heteroaryl group, Ar$^{1a}$ and Ar$^{2a}$ may independently be present alone or may be linked with each other to form a fused ring, and R$^{1a}$ to R$^{3a}$, R$^a$, and R$^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, in Chemical Formula A-1, Ar$^{1a}$ and Ar$^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

In some example embodiments, Ar$^{1a}$ and Ar$^{2a}$ of Chemical Formula A-1 may be linked with each other to form a ring or in some example embodiments, Ar$^{1a}$ and Ar$^2$a may be linked with each other by one of a single bond, —(CR$^9$R$^h$)$_{n2}$— (n2 is 1 or 2), —O—, —S—, —Se—, —N═, —NR$^i$—, —SiR$^j$R$^k$—, or —GeR$^l$R$^m$— to form a ring. Herein, R$^9$ to R$^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the p-type semiconductor 30-1 represented by Chemical Formula A may be for example represented by Chemical Formula A-2.

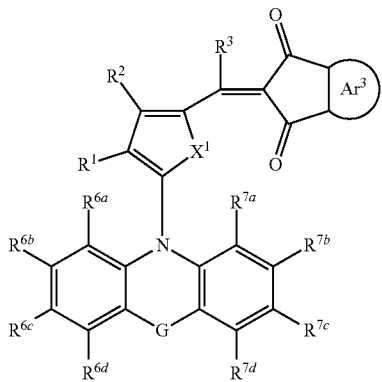

[Chemical Formula A-2]

In Chemical Formula A-2, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or a combination thereof, G may be one of a single bond, —O—, —S—, —Se—, —N═, —$(CR^f R^g)_k$—, —$NR^h$—, —$SiR^i R^j$—, —$GeR^k RR^l$—, —$(C(R^m)$═$C(R^n))$—, or $SnR^o R^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, or a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or a combination thereof, $R^{6a}$ to $R^{6d}$ may independently be present alone or adjacent two thereof may be linked with each other to form a fused ring, and $R^{7a}$ to $R^{7d}$ may independently be present alone or adjacent two thereof may be linked with each other to form a fused ring.

In some example embodiments, $Ar^3$ of Chemical Formula A-2 may be benzene, naphthylene, anthracene, thiophene, selenophene, tellurophene, pyridine, pyrimidine, or a fused ring of the foregoing two or more.

The n-type semiconductor 30-2 may be for example fullerene or a fullerene derivative, but is not limited thereto.

The photoelectric conversion layer 30 may be an intrinsic layer (an I layer) wherein the p-type semiconductor 30-1 and the n-type semiconductor 30-2 are mixed as a bulk heterojunction. Herein, the p-type semiconductor 30-1 and the n-type semiconductor 30-2 may be mixed in a volume ratio of about 1:9 to about 9:1, for example about 2:8 to about 8:2, about 3:7 to about 7:3, about 4:6 to about 6:4, or about 5:5.

The photoelectric conversion layer 30 may include a bilayer including a p-type layer including the aforementioned p-type semiconductor 30-1 and an n-type layer including the aforementioned n-type semiconductor 30-2. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 30 may further include a p-type layer and/or an n-type layer in addition to the intrinsic layer. The p-type layer may include the aforementioned p-type semiconductor 30-1 and the n-type layer may include the aforementioned n-type semiconductor 30-2. In some example embodiments, they may be included in various combinations of p-type layer/I layer, I layer/n-type layer, p-type layer/I layer/n-type layer, and the like.

The charge transport layer 40 may be disposed between the first electrode 10 and the photoelectric conversion layer 30 and may be for example in contact with the first electrode 10. In some example embodiments, one surface of the charge transport layer 40 may be in contact with the first electrode 10, and the other surface of the charge transport layer 40 may be in contact with the photoelectric conversion layer 30.

The charge transport layer 40 may include a plurality of charge transport materials, and each charge transport material may be a non-absorbing material (e.g., a material that is configured to not absorb light), unlike the aforementioned p-type semiconductor 30-1 and n-type semiconductor 30-2. The plurality of charge transport materials may be mixed.

In some example embodiments, as shown in FIG. 1, the charge transport layer 40 may include a first charge transport material 40-1 and a second charge transport material 40-2, and for example the first charge transport material 40-1 and the second charge transport material 40-2 may collectively form (e.g., define) a heterojunction 40h. In some example embodiments, each material of the first charge transport material 40-1 and the second charge transport material 40-2 may be a non-absorbing material.

In some example embodiments, a difference between the energy bandgap of the first charge transport material 40-1 and the energy bandgap of the second charge transport material 40-2 may be relatively small, for example greater than about 0 eV and less than or equal to about 0.2 eV. In some example embodiments, the difference between the energy bandgap of the first charge transport material 40-1 and the energy bandgap of the second charge transport material 40-2 may be greater than about 0 eV and less than or equal to about 0.18 eV, greater than about 0 eV and less than or equal to about 0.15 eV, greater than about 0 eV and less than or equal to about 0.13 eV, greater than about 0 eV and less than or equal to about 0.1 eV, greater than about 0 eV and less than or equal to about 0.08 eV, or greater than about 0 eV and less than or equal to about 0.05 eV.

In some example embodiments, a difference between the Lowest Unoccupied Molecular Orbital (LUMO) energy level of the first charge transport material 40-1 and the LUMO energy level of the second charge transport material 40-2 may be relatively small, for example less than or equal to about 0.05 eV. In some example embodiments, the difference between the LUMO energy level of the first charge transport material 40-1 and the LUMO energy level of the second charge transport material 40-2 may be less than or equal to about 0.04 eV, less than or equal to about 0.03 eV, less than or equal to about 0.02 eV, or less than or equal to about 0.01 eV. In some example embodiments, the LUMO energy level of the first charge transport material 40-1 may be shallower than the LUMO energy level of the second charge transport material 40-2.

In some example embodiments, a difference between the LUMO energy levels of the first charge transport material 40-1 and the n-type semiconductor 30-2 included in the photoelectric conversion layer 30 may be relatively large, in some example embodiments, may have a relatively large energy barrier of greater than or equal to about 0.5 eV. In some example embodiments, the difference between the LUMO energy levels of the first charge transport material 40-1 and the n-type semiconductor 30-2 included in photoelectric conversion layer 30 may be greater than or equal to about 0.8 eV, greater than or equal to about 1.0 eV, greater than or equal to about 1.2 eV, greater than or equal to about 1.4 eV, greater than or equal to about 1.6 eV, greater than or equal to about 1.8 eV, greater than or equal to about 2.0 eV, greater than or equal to about 2.5 eV, or greater than or equal to about 3.0 eV, or within the range about 0.8 eV to about 3.0 eV, about 1.0 eV to about 3.0 eV, about 1.0 eV to about 2.5 eV, about 1.0 eV to about 2.0 eV, about 1.0 eV to about 1.8 eV, about 1.0 eV to about 1.6 eV, about 1.0 eV to about 1.4 eV, or about 1.2 eV to about 1.4 eV.

In some example embodiments, a difference between the LUMO energy levels of the second charge transport material 40-2 and the n-type semiconductor 30-2 included in the photoelectric conversion layer 30 may be relatively large, in some example embodiments, may have a relatively large energy barrier of greater than or equal to about 0.5 eV. In some example embodiments, the difference between the LUMO energy levels of the second charge transport material 40-2 and the n-type semiconductor 30-2 included in the photoelectric conversion layer 30 may be greater than or equal to about 0.8 eV, greater than or equal to about 1.0 eV, greater than or equal to about 1.2 eV, greater than or equal to about 1.4 eV, greater than or equal to about 1.6 eV, greater than or equal to about 1.8 eV, greater than or equal to about 2.0 eV, greater than or equal to about 2.5 eV, or greater than or equal to about 3.0 eV, or within the range about 0.8 eV to about 3.0 eV, about 1.0 eV to about 3.0 eV, about 1.0 eV to about 2.5 eV, about 1.0 eV to about 2.0 eV, about 1.0 eV to about 1.8 eV, about 1.0 eV to about 1.6 eV, about 1.0 eV to about 1.4 eV, or about 1.2 eV to about 1.4 eV.

As described above, the first charge transport material 40-1 and the second charge transport material 40-2 included in the charge transport layer 40 have different energy band gaps and form (e.g., collectively define) heterojunctions 40h. An imbalance of charge may be generated at the interface 40i between the first charge transport material 40-1 and the second charge transport material 40-2. In some example embodiments, the interface 40i between the first charge transport material 40-1 and the second charge transport material 40-2 may have charges, in some example embodiments, positive charges, such that the charge transport layer 40 has a positive charge at the interface 40i.

The first charge transport material 40-1 and the second charge transport material 40-2 may independently be an organic material, an inorganic material or organic/inorganic material. In some example embodiments, at least one of the first charge transport material 40-1 or the second charge transport material 40-2 may be an organic material.

In some example embodiments, each of the first charge transport material 40-1 and the second charge transport material 40-2 may be an organic material.

In some example embodiments, the first charge transport material 40-1 and the second charge transport material 40-2 may be organic materials having different structures, and may include a nitrogen-containing ring in common. Herein, the nitrogen-containing ring may be for example pyridine, pyrimidine or triazine, for example pyrimidine or triazine.

In some example embodiments, the first charge transport material 40-1 and the second charge transport material 40-2 may be organic materials having different structures, in some example embodiments, may include a cyano group in common.

In some example embodiments, the first charge transport material 40-1 and the second charge transport material 40-2 may be organic materials having different structures, and may include, in some example embodiments, a nitrogen-containing ring and a cyano group in common. Restated, the first charge transport material 40-1 and the second charge transport material 40-2 may be organic materials having different structures, and may have a same nitrogen-containing ring and a same cyano group.

In some example embodiments, the first charge transport material 40-1 may be represented by, in some example embodiments, the following Chemical Formula 1.

[Chemical Formula 1]

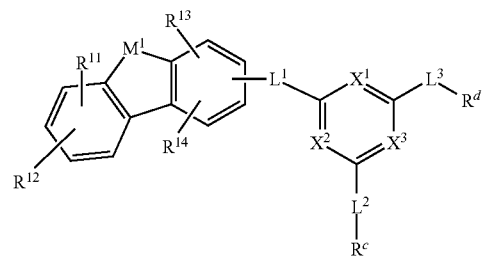

In Chemical Formula 1,
$X^1$ to $X^3$ may independently be $CR^a$ or N,
at least two of $X^1$ to $X^3$ may be N,
$M^1$ may be O, S, Se, Te, or $NR^b$,
$R^a$ and $R^b$ may independently be hydrogen, a substituted or unsubstituted C1 to C30 alkyl group, or a substituted or unsubstituted C6 to C30 aryl group,
$R^c$ and $R^d$ may be a substituted or unsubstituted C6 to C30 aryl group, a substituted or unsubstituted C3 to C30 heterocyclic group, or a cyano group,
$L^1$ to $L^3$ may independently be a single bond, a substituted or unsubstituted C1 to C6 alkylene group, a substituted or unsubstituted C6 to C30 arylene group, or a combination thereof, and
$R^{11}$ to $R^{14}$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, in Chemical Formula 1, $X^1$ to $X^3$ may independently be N.

In some example embodiments, in Chemical Formula 1, $M^1$ may be O or S.

In some example embodiments, $L^1$ to $L^3$ may independently be a single bond or a substituted or unsubstituted C6 to C30 arylene group.

In some example embodiments, $R^c$ and $R^d$ may be a substituted or unsubstituted C6 to C30 aryl group or a cyano group, and $R^{11}$ to $R^{14}$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, the second charge transport material 40-2 may be for example represented by Chemical Formula 2.

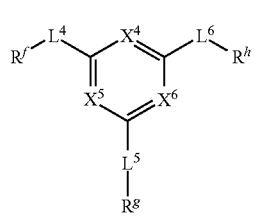

[Chemical Formula 2]

In Chemical Formula 2,
$X^4$ to $X^6$ may independently be $CR^e$ or N,
at least two of $X^4$ to $X^6$ may be N,
$R^e$ may be hydrogen, a substituted or unsubstituted C1 to C30 alkyl group, or a substituted or unsubstituted C6 to C30 aryl group,
$R^f$ to $R^h$ may be a substituted or unsubstituted C6 to C30 aryl group, a substituted or unsubstituted C3 to C30 heterocyclic group, or a cyano group, and
$L^4$ to $L^6$ may independently be a single bond, a substituted or unsubstituted C1 to C6 alkylene group, a substituted or unsubstituted C6 to C30 arylene group, or a combination thereof.

In some example embodiments, in Chemical Formula 2, $X^4$ to $X^6$ may independently be N.

In some example embodiments, $L^4$ to $L^6$ may independently be a single bond or a substituted or unsubstituted C6 to C30 arylene group.

As described above, the charge transport layer 40 includes the first charge transport material 40-1 and the second charge transport material 40-2 that may form a heterojunction, and thus may have positive charges at the interface of the first charge transport material 40-1 and the second charge transport material 40-2 when an electric field is applied. Accordingly, despite the relatively large energy barriers of the LUMO energy level of the n-type semiconductor 30-2 of the photoelectric conversion layer 30 and each LUMO energy level of the first charge transport material 40-1 or the second charge transport material 40-2, transfer of charges (e.g., electrons) from the photoelectric conversion layer 30 to the first electrode 10 may be promoted to increase charge extraction efficiency. Accordingly, unwanted charges remaining at the interface between adjacent layers between the photoelectric conversion layer 30 and the first electrode 10 may be decreased to reduce or prevent image retention due to accumulated remaining charge carriers. Therefore, the electrical performance of the photoelectric device may be improved.

The charge transport layer 40 may be a very thin film of several nanometers thickness. In some example embodiments, it may be a very thin film having a thickness 40t of less than or equal to about 10 nm, less than or equal to about 8 nm, less than or equal to about 5 nm, less than or equal to about 3 nm, or less than or equal to about 2 nm. The charge transport layer 40 may have for example a thickness of about 2 nm to about 10 nm, about 3 nm to about 10 nm, about 5 nm to about 10 nm, or about 5 nm to about 8 nm.

An additional layer (not shown) may be further included between the first electrode 10 and the charge transport layer 40. The additional layer may be for example a charge injection layer, but is not limited thereto. The charge injection layer may include for example lithium quinolate, but is not limited thereto.

The photoelectric device 100 may further include an anti-reflection layer (not shown) on one surface of the first electrode 10 or the second electrode 20. The anti-reflection layer is disposed at a light incidence side and lowers reflectance of light of incident light and thereby light absorbance is further improved. In some example embodiments, when light is incident to the first electrode 10, the anti-reflection layer may be disposed on one surface of the first electrode 10, and when light is incident to the second electrode 20, anti-reflection layer may be disposed on one surface of the second electrode 20.

The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; a metal sulfide such as zinc sulfide; or an organic material such as an amine derivative, but is not limited thereto.

In the photoelectric device 100, when light enters from the first electrode 10 or the second electrode 20 and the photoelectric conversion layer 30 absorbs light in a predetermined wavelength region, excitons may be produced thereinside. The excitons are separated into holes and electrons in the photoelectric conversion layer 30, and the separated holes are transported to an anode that is one of the first electrode 10 or the second electrode 20 and the separated electrons are transported to the cathode that is the other of the first electrode 10 and the second electrode 20 so as to flow a current.

Hereinafter, a photoelectric device according to some example embodiments is described.

Figure 2:
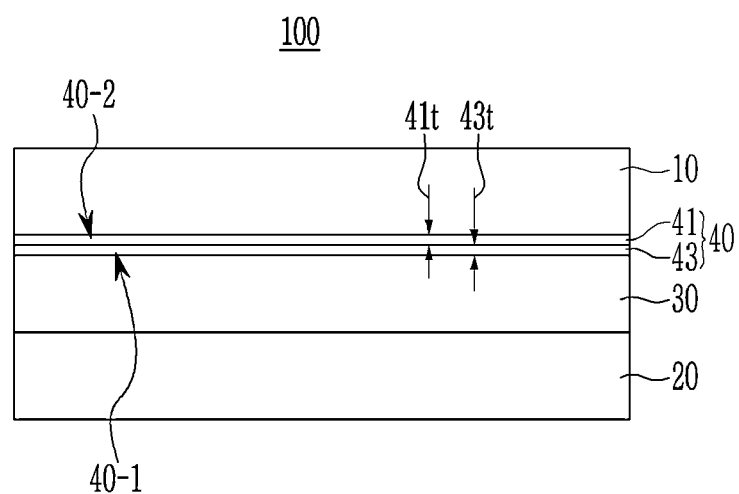
FIG. 2 is a cross-sectional view showing a photoelectric device according to some example embodiments.

FIG. 2 is a cross-sectional view showing a photoelectric device according to some example embodiments.

Referring to FIG. 2, a photoelectric device 100 according to some example embodiments includes a first electrode 10, a second electrode 20, a photoelectric conversion layer 30, and a charge transport layer 40.

However, in some example embodiments, the charge transport layer 40 includes a first charge transport layer 43 and a second charge transport layer 41. The first charge transport layer 43 and the second charge transport layer 41 may include one of the aforementioned first charge transport material 40-1 or second charge transport material 40-2.

In some example embodiments, the first charge transport layer 43 may include a first charge transport material 40-1 and the second charge transport layer 41 may include a second charge transport material 40-2.

In some example embodiments, the first charge transport layer 43 may include a second charge transport material 40-2 and the second charge transport layer 41 may include a first charge transport material 40-1.

In some example embodiments, including the example embodiments shown in FIG. 2, the first charge transport layer 43 and the second charge transport layer 41 may be in contact with each other. In some example embodiments, one surface of the first charge transport layer 43 may be in contact with the photoelectric conversion layer 30 and the other surface of the first charge transport layer 43 may be in contact with the second charge transport layer 41. In some example embodiments, one surface of the second charge transport layer 41 may be in contact with the first electrode 10, and the other surface of the second charge transport layer 41 may be in contact with one surface of the first charge transport layer 43. In some example embodiments, one surface of the first charge transport layer 43 may be in contact with the photoelectric conversion layer 30, the other surface of the first charge transport layer 43 may be in contact with the second charge transport layer 41, and the second charge transport layer 41 may be in contact with the second charge transport layer 41.

In some example embodiments, the first charge transport layer 43 may be disposed closer to the photoelectric conversion layer 30 than the second charge transport layer 41. In some example embodiments, the LUMO energy level of the first charge transport material 40-1 of the first charge transport layer 43 is shallower than the LUMO energy level of the second charge transport material 40-2 of the second charge transport layer 41.

The first charge transport layer 43 and/or the second charge transport layer 41 may further include other materials in addition to the aforementioned first charge transport material 40-1 or second charge transport material 40-2.

In some example embodiments, the second charge transport layer 41 may further include a third charge transport material different from the first charge transport material 40-1 and the second charge transport material 40-2. In some example embodiments, the third charge transport material may be an organic material, an inorganic material, or an organic/inorganic material, and may include, in some example embodiments, a metal complex. In some example embodiments, the metal complex may include lithium quinolate (LiQ). The third charge transport material may be included in less than about 50% by volume with respect to the second charge transport layer 41. Within the ranges, it may be included in an amount of less than or equal to about 40 volume %, less than or equal to about 30 volume %, less than or equal to about 20 volume %, less than or equal to about 10 volume %, or less than or equal to about 5 volume %.

The first charge transport layer 43 may have for example a thickness 43*t* of less than or equal to about 5 nm, less than or equal to about 4 nm, less than or equal to about 3 nm, less than or equal to about 2 nm, or less than or equal to about 1 nm.

The second charge transport layer 41 may have for example a thickness 41*t* of less than or equal to about 5 nm, less than or equal to about 4 nm, less than or equal to about 3 nm, less than or equal to about 2 nm, or less than or equal to about 1 nm.

An additional layer (not shown) may be further included between the first electrode 10 and the charge transport layer 40. The additional layer may be for example a charge injection layer, but is not limited thereto. The charge injection layer may include for example lithium quinolate, but is not limited thereto.

Hereinafter, a photoelectric device according to some example embodiments is described.

Figure 3:
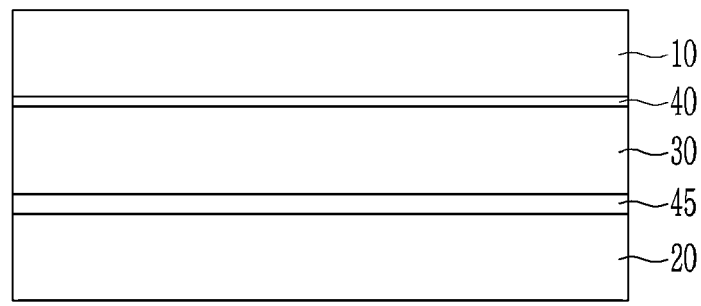
FIG. 3 is a cross-sectional view showing a photoelectric device according to some example embodiments.

FIG. 3 is a cross-sectional view showing a photoelectric device according to some example embodiments.

Referring to FIG. 3, a photoelectric device 100 according to some example embodiments includes a first electrode 10, a second electrode 20, a photoelectric conversion layer 30, and a charge transport layer 40, like the aforementioned example embodiments.

However, in some example embodiments, the photoelectric device 100 according to some example embodiments further includes a charge auxiliary layer 45 between the second electrode 20 and the photoelectric conversion layer 30, in some example embodiments. The charge auxiliary layer 45 may increase efficiency by facilitating the movement of charges (in some example embodiments, holes) separated in the photoelectric conversion layer 30.

The charge auxiliary layer 45 may include, for example an organic material, an inorganic material, or an organic/inorganic material. The organic material may be an organic compound having hole or electron characteristics and the inorganic material may be, for example metal oxide such as molybdenum oxide, tungsten oxide, or nickel oxide.

In some example embodiments, the charge auxiliary layer may be a compound represented by Chemical Formula 2A or 2B, but is not limited thereto.

[Chemical Formula 2A]

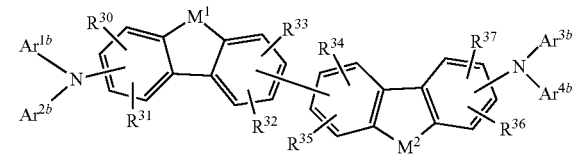

[Chemical Formula 2B]

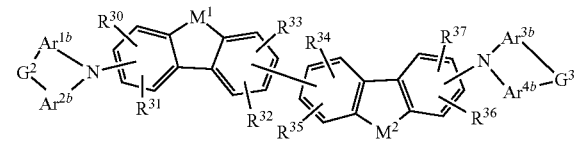

In Chemical Formula 2A or 2B, $M^1$ and $M^2$ may independently be $CR^nR^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group or a substituted or unsubstituted C3 to C30 heteroaryl group, $G^2$ and $G^3$ may independently be a single bond, —$(CR^sR^t)_{n3}$—, —O—, —S—, —Se—, —N=, —$NR^u$—, —$SiR^vR^w$—, or —$GeR^xR^y$—, wherein n3 is 1 or 2, and $R^{30}$ to $R^{37}$ and $R^n$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, the charge auxiliary layer may be a compound represented by Chemical Formula 2A-1 or 2B-1, but is not limited thereto.

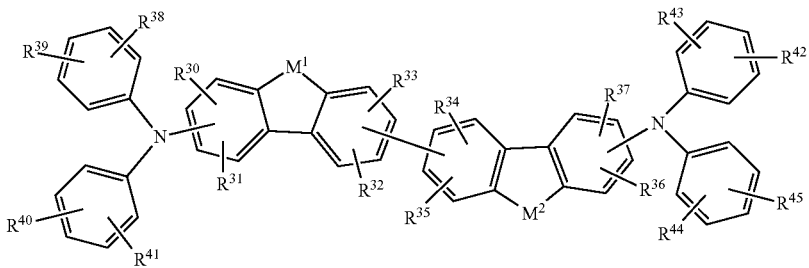

[Chemical Formula 2A-1]

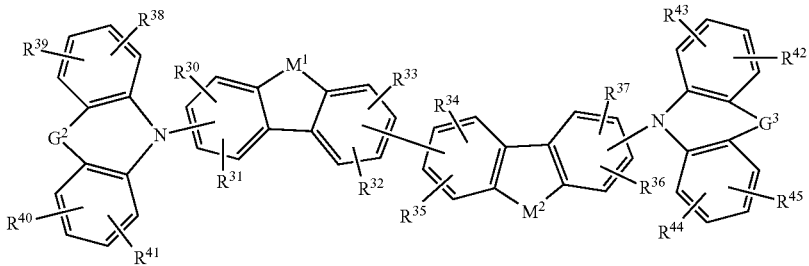

[Chemical Formula 2B-1]

In Chemical Formula 2A-1 or 2B-1, $M^1$, $M^2$, $G^2$, $G^3$, and $R^{30}$ to $R^{37}$ are the same as described above, and $R^{38}$ to $R^{45}$ may independently be hydrogen, a substituted or unsubstituted C to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the charge auxiliary layer may be a compound represented by Chemical Formula 2A-1a or 2B-1a, but is not limited thereto.

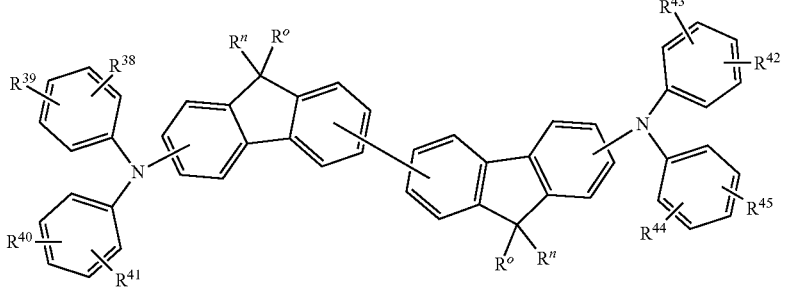

[Chemical Formula 2A-1a]

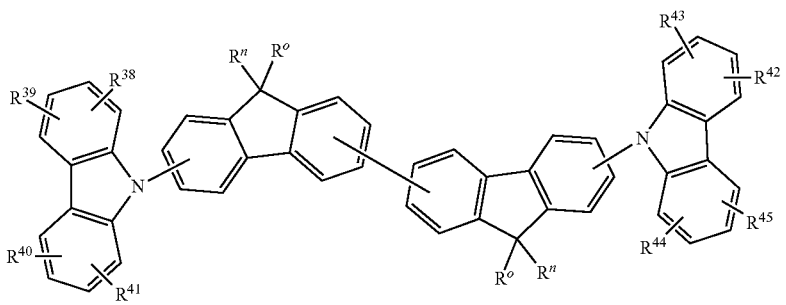

[Chemical Formula 2B-1a]

In Chemical Formula 2A-1a or 2B-1a, $R^{38}$ to $R^{45}$ and $R^o$ and $R^n$ are the same as described above.

The aforementioned photoelectric device 100 may be applied to various electronic devices, for example a solar cell, an organic sensor, a photodetector, and a photosensor, but is not limited thereto.

The photoelectric device 100 may be applied to a sensor, for example an image sensor that is an example of the sensor.

Hereinafter, embodiments of image sensors including the aforementioned photoelectric device will be described with reference to the drawings. Herein, an organic CMOS image sensor will be described as an example of an image sensor.

Figure 4:
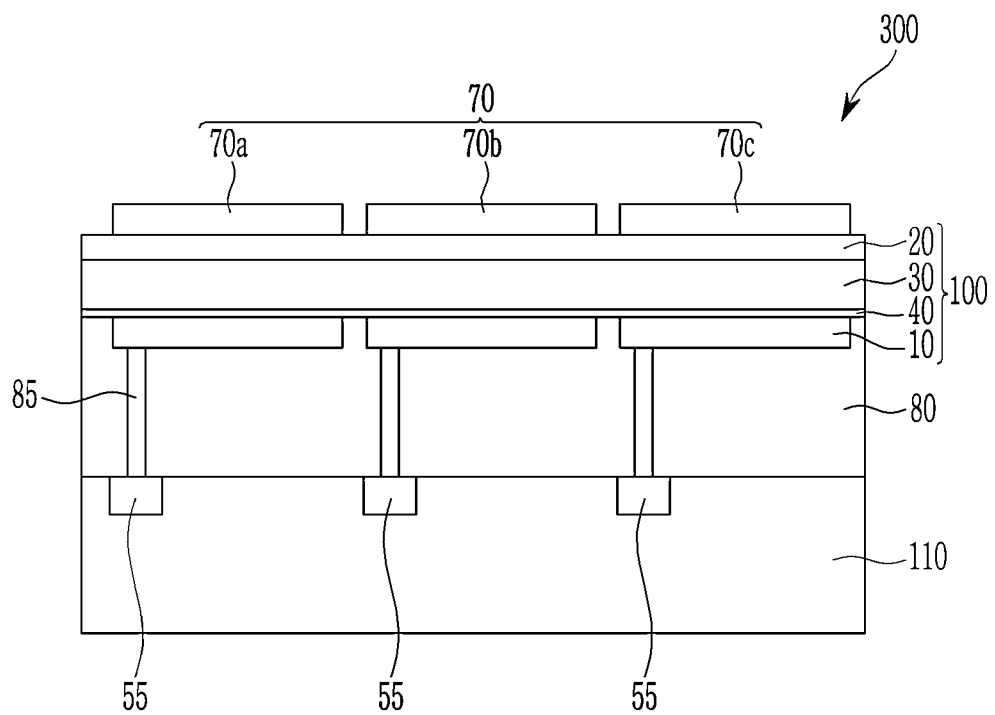
FIG. 4 is a cross-sectional view showing some example embodiments of an organic CMOS image sensor.

FIG. 4 is a schematic cross-sectional view showing some example embodiments of an image sensor according to some example embodiments.

In some example embodiments, the sensor may be an organic CMOS image sensor.

Referring to FIG. 4, an image sensor 300 according to some example embodiments includes a semiconductor substrate 110, an insulation layer 80, a photoelectric device 100, and a color filter layer 70.

The semiconductor substrate 110 may be a silicon substrate, and is integrated with the transmission transistor (not shown) and the charge storage 55. The transmission transistor and/or the charge storage 55 may be integrated in each pixel. The charge storage 55 is electrically connected to the photoelectric device 100.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), or an alloy thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a through-hole 85 exposing the charge storage 55. The through-hole 85 may be filled with fillers.

The aforementioned photoelectric device 100 is formed on the insulation layer 80. The photoelectric device 100 includes a first electrode 10, a charge transport layer 40, a photoelectric conversion layer 30, and a second electrode 20 as described above. The second electrode 20 may be a light-receiving electrode. Specific description is the same as described above.

The color filter layer 70 is formed on photoelectric device 100. The color filter layer 70 includes a blue filter 70a formed in a blue pixel, a red filter 70b formed in a red pixel, and a green filter 70c formed in a green pixel. However, it may include a cyan filter, a magenta filter, and/or a yellow filter instead of the above filters or may further include them in addition to the above filters.

Focusing lens (not shown) may be further formed on the color filter layer 70. The focusing lens may control a direction of incident light and gather the light in one region. The focusing lens may have a shape of, in some example embodiments, a cylinder or a hemisphere, but is not limited thereto.

Even though the structure including the stacked photoelectric device 100 of FIG. 1 is for example illustrated in FIG. 4, a structure in which the photoelectric device 100 of FIG. 2 or 3 is stacked may be applied in the same manner.

Figure 5:
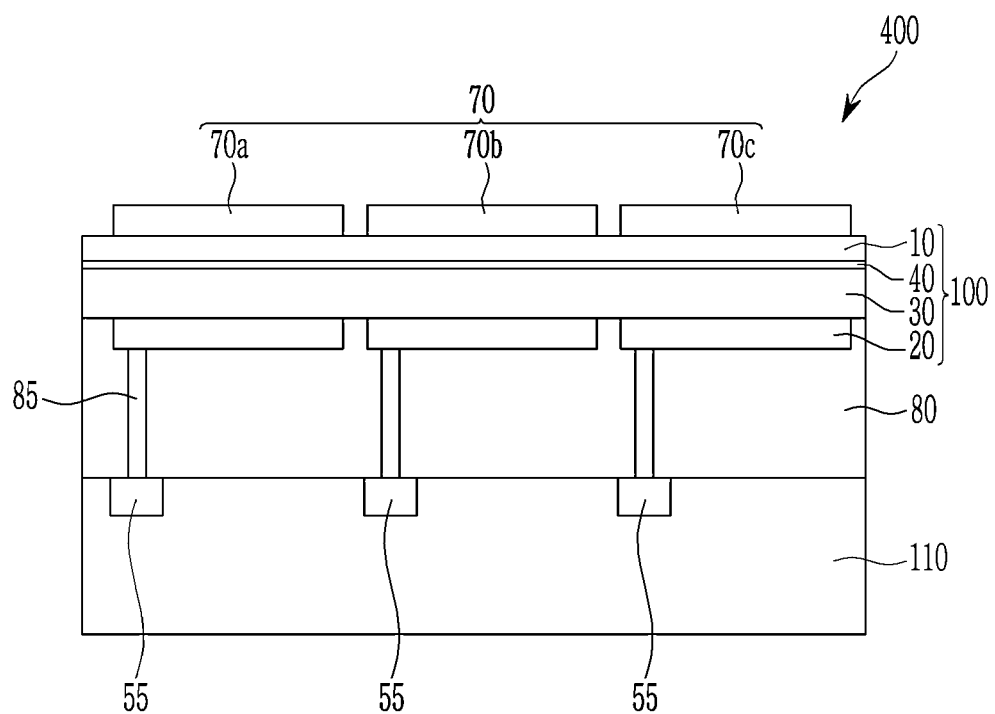
FIG. 5 is a cross-sectional view showing some example embodiments of an organic CMOS image sensor.

FIG. 5 is a schematic cross-sectional view showing an example of an image sensor according to some example embodiments.

Referring to FIG. 5, an image sensor 400 according to some example embodiments includes a semiconductor substrate 110 integrated with a transmission transistor (not shown) and a charge storage 55, an insulation layer 80, a photoelectric device 100; and a color filter layer 70.

However, in the image sensor 400 according to some example embodiments, the positions of the first electrode 10 and the second electrode 20 of the photoelectric device 100 are changed, in some example embodiments. That is, the first electrode 10 may be a light-receiving electrode.

Even though the structure including the stacked photoelectric device 100 of FIG. 1 is for example illustrated in FIG. 5, a structure in which the photoelectric device 100 of FIG. 2 or 3 is stacked may be applied in the same manner.

Figure 6:
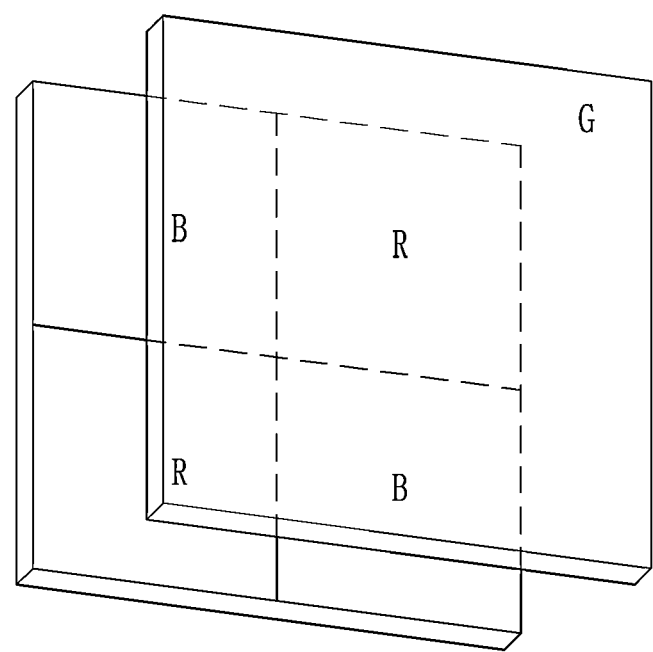
FIG. 6 is a schematic top plan view showing an organic CMOS image sensor according to some example embodiments.
Figure 7:
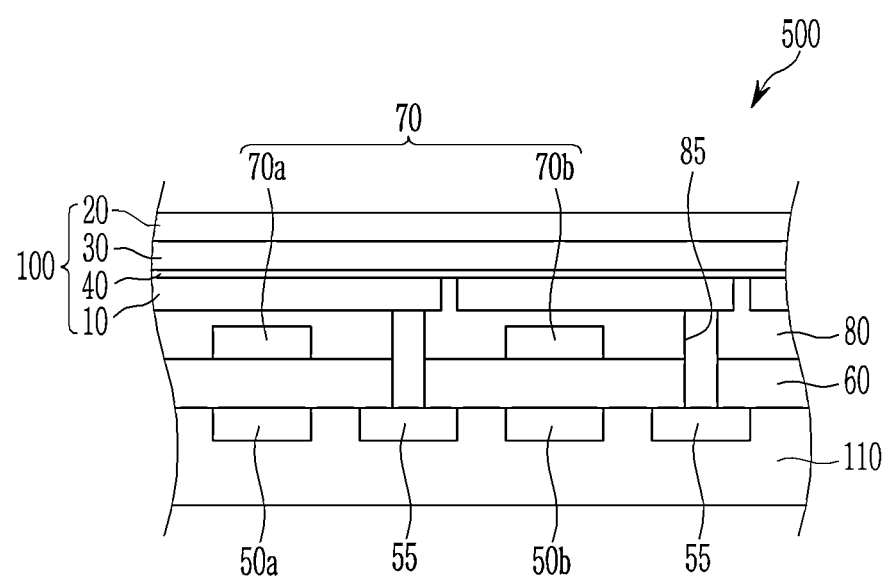
FIG. 7 is a cross-sectional view showing some example embodiments of the organic CMOS image sensor shown in FIG. 6.

FIG. 6 is a schematic top plan view showing an organic CMOS image sensor according to some example embodiments and FIG. 7 is a cross-sectional view showing some example embodiments of the organic CMOS image sensor shown in FIG. 6.

Referring to FIGS. 6 and 7, an organic CMOS image sensor 500 some example embodiments according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric device 100.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a through-hole 85 exposing the charge storage 55. The through-hole 85 may be filled with fillers.

The color filter layer 70 is formed on the lower insulation layer 60. The color filter layer 70 includes a blue filter 70a formed in a blue pixel and a red filter 70b in a red pixel. In some example embodiments, a green filter is not included, but a green filter may be further included.

The upper insulation layer 80 is formed on the color filter layer 70. The upper insulation layer 80 eliminates a step caused by the color filter layer 70 and smoothens the surface.

The upper insulation layer 80 and the lower insulation layer 60 may include a contact hole (not shown) exposing a pad, and a through-hole 85.

The aforementioned photoelectric device 100 is formed on the upper insulation layer 80. The photoelectric device 100 includes the first electrode 10, the charge transport layer 40, the photoelectric conversion layer 30, and the second electrode 20 as described above. Details are the same as described above.

Focusing lens (not shown) may be further formed on the photoelectric device 100. The focusing lens may control a direction of incident light and gather the light in one region. The focusing lens may have a shape of, in some example embodiments, a cylinder or a hemisphere, but is not limited thereto.

Even though the structure including the stacked photoelectric device 100 of FIG. 1 is for example illustrated in FIG. 7, a structure in which the photoelectric device 100 of FIG. 2 or the photoelectric device 100 of FIG. 3 is stacked may be applied in the same manner.

Figure 8:
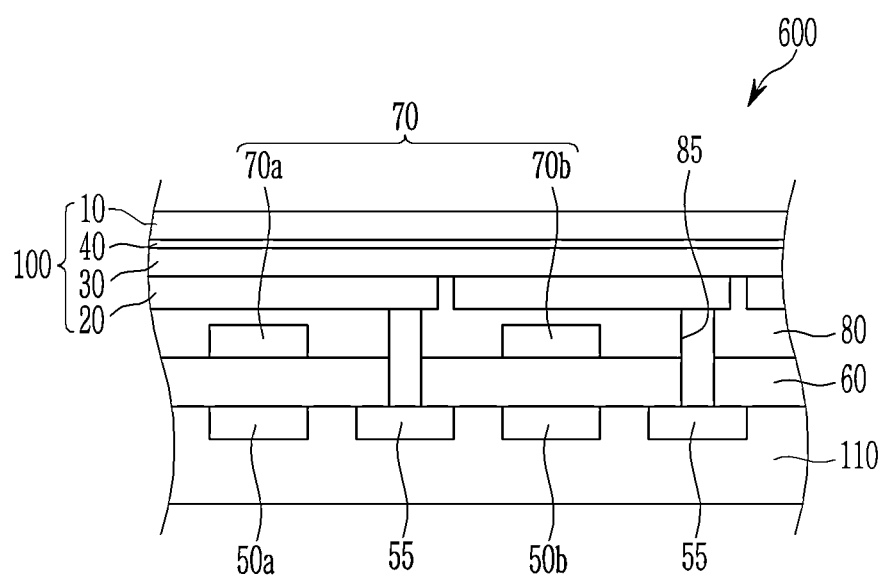
FIG. 8 is a cross-sectional view showing some example embodiments of an organic CMOS image sensor.

FIG. 8 is a cross-sectional view showing some example embodiments of an organic CMOS image sensor.

Referring to FIG. 8, an image sensor 600 according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric device 100, like the aforementioned example embodiments.

However, in the image sensor 600 according to some example embodiments, the positions of the first electrode 10 and the second electrode 20 are changed, in some example embodiments. That is, the first electrode 10 may be a light-receiving electrode.

Even though the structure including the stacked photoelectric device 100 of FIG. 1 is for example illustrated in FIG. 8, a structure in which the photoelectric device 100 of FIG. 2 or the photoelectric device 100 of FIG. 3 is stacked may be applied in the same manner.

Figure 9:
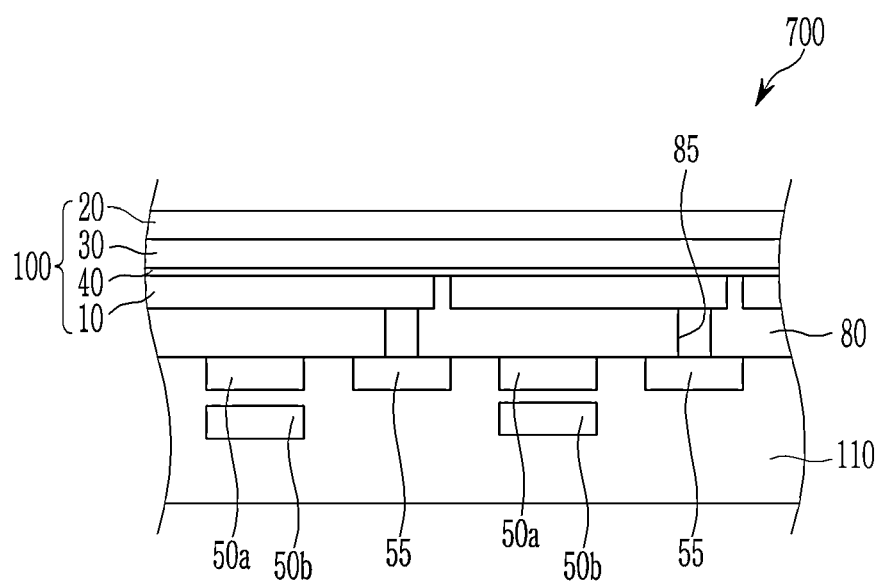
FIG. 9 is a cross-sectional view showing some example embodiments of an organic CMOS image sensor.

FIG. 9 is a cross-sectional view showing some example embodiments of an organic CMOS image sensor.

An image sensor 700 according to some example embodiments includes a semiconductor substrate 110 integrated with photo-sensing devices 50a and 50b, a transmission transistor (not shown), and a charge storage 55, an upper insulation layer 80 including a through-hole 85, and a photoelectric device 100, like the aforementioned example embodiments.

However, in the image sensor 700 according to some example embodiments, the photo-sensing devices 50a and 50b are stacked in a vertical direction and the color filter layer 70 is omitted, in some example embodiments. The photo-sensing devices 50a and 50b may be electrically connected to the charge storage 55 and may be transferred by transmission transistors. The photo-sensing devices 50a and 50b may selectively absorb light in each wavelength region, depending on a stacking depth.

Even though the structure including the stacked photoelectric device 100 of FIG. 1 is for example illustrated in FIG. 9, a structure in which the photoelectric device 100 of FIG. 2 or the photoelectric device 100 of FIG. 3 is stacked may be applied in the same manner.

Figure 10:
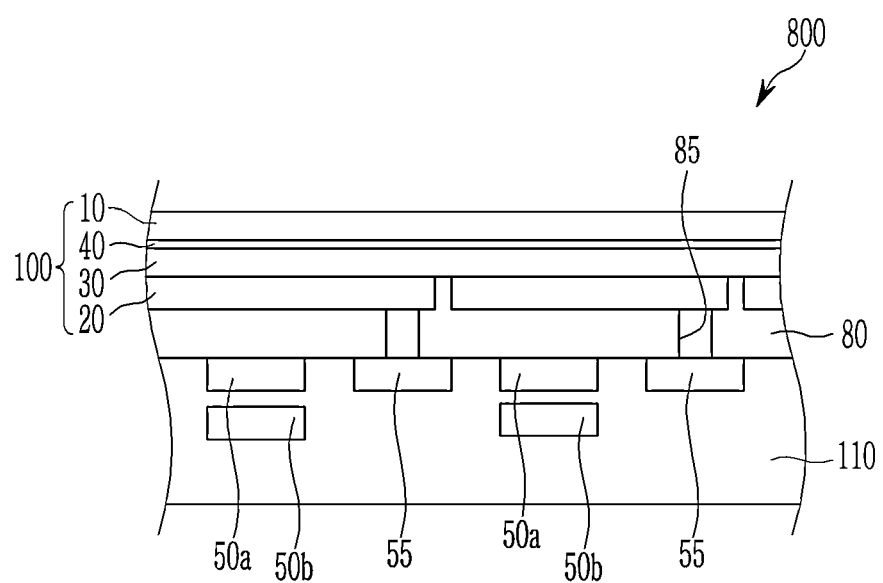
FIG. 10 is a cross-sectional view showing some example embodiments of an organic CMOS image sensor.

FIG. 10 is a cross-sectional view showing some example embodiments of an organic CMOS image sensor.

Referring to FIG. 10, an image sensor 800 according to some example embodiments includes a semiconductor substrate 110 integrated with photo-sensing devices 50a and 50b, a transmission transistor (not shown), and a charge storage 55, an upper insulation layer 80 including a through-hole 85, and a photoelectric device 100, like the aforementioned example embodiments. However, in the image sensor 800 according to some example embodiments, the positions of the first electrode 10 and the second electrode 20 are changed, in some example embodiments. That is, the first electrode 10 may be a light-receiving electrode.

Even though the structure including the stacked photoelectric device 100 of FIG. 1 is for example illustrated in FIG. 10, a structure in which the photoelectric device 100 of FIG. 2 or the photoelectric device 100 of FIG. 3 is stacked may be applied in the same manner.

Figure 11:
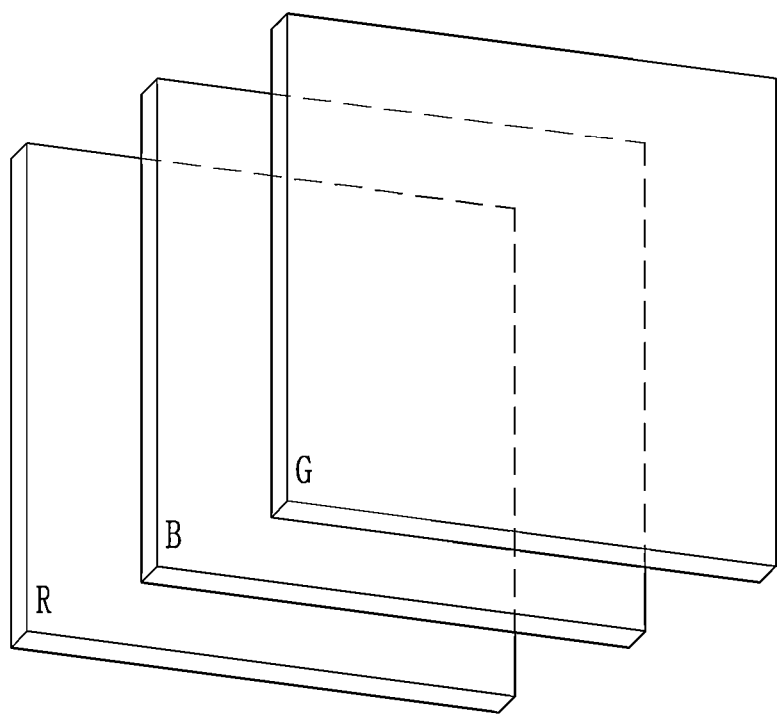
FIG. 11 is a schematic top plan view showing an organic CMOS image sensor according to some example embodiments.
Figure 12:
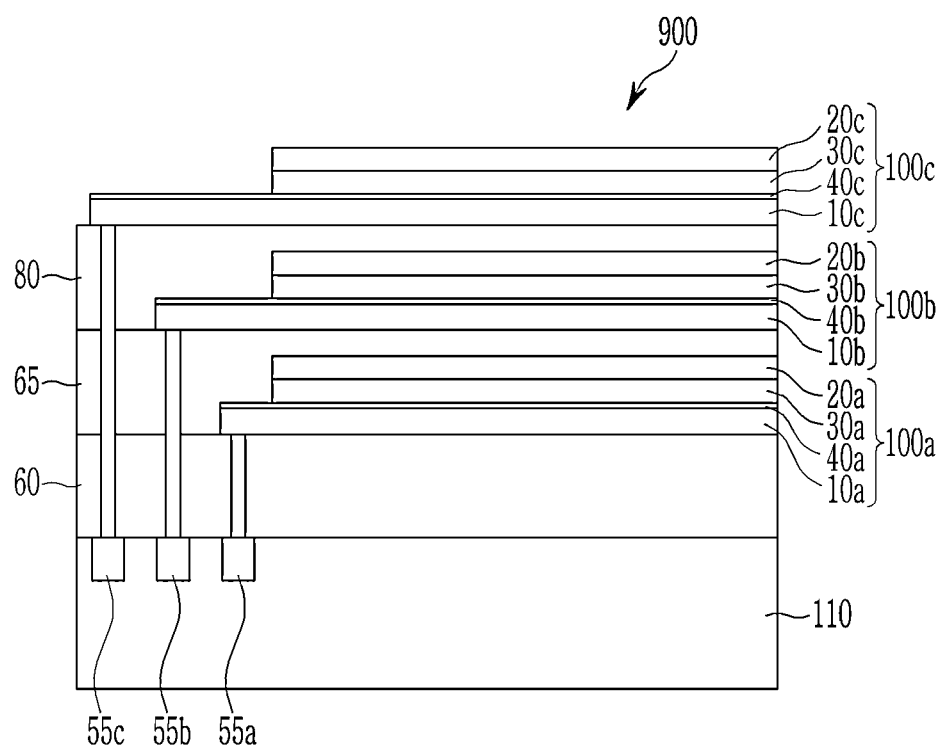
FIG. 12 is a cross-sectional view of the organic CMOS image sensor of FIG. 11.

FIG. 11 is a schematic top plan view showing an organic CMOS image sensor according to some example embodiments and FIG. 12 is a cross-sectional view of the organic CMOS image sensor of FIG. 11.

An organic CMOS image sensor 900 according to some example embodiments has a structure in which a green photoelectric device configured to selectively absorb light in a green wavelength region, a blue photoelectric device configured to selectively absorb light in a blue wavelength region, and a red photoelectric device configured to selectively absorb light in a red wavelength region are stacked.

The organic CMOS image sensor 900 according to some example embodiments includes a semiconductor substrate 110, a lower insulation layer 60, an intermediate insulation layer 65, an upper insulation layer 80, a first photoelectric device 100a, a second photoelectric device 100b, and a third photoelectric device 100c.

The semiconductor substrate 110 may be a silicon substrate, and is integrated with the transmission transistor (not shown) and the charge storage 55a, 55b, and 55c.

A metal wire (not shown) and a pad (not shown) are formed on the semiconductor substrate 110, and the lower insulation layer 60 is formed on the metal wire and the pad.

The first photoelectric device 100a is formed on the lower insulation layer 60.

The first photoelectric device 100a includes a first electrode 10a and a second electrode 20a facing each other, and a photoelectric conversion layer 30a and a charge transport layer 40a disposed between the first electrode 10a and the second electrode 20a. The first electrode 10a, the second electrode 20a, the photoelectric conversion layer 30, and the charge transport layer 40a are the same as described above, and the photoelectric conversion layer 30a may selectively absorb light in one of red, blue, or green wavelength regions. In some example embodiments, the first photoelectric device 100a may be a red photoelectric device.

The intermediate insulation layer 65 may be formed on the first photoelectric device 100a.

The second photoelectric device 100b may be formed on the intermediate insulation layer 65.

The second photoelectric device 100b includes a first electrode 10b and a second electrode 20b, and photoelectric conversion layer 30b and a charge transport layer 40b between the first electrode 10b and the second electrode 20b. The first electrode 10b, the second electrode 20b, the photoelectric conversion layer 30b, and the charge transport layer 40b are the same as described above, and the photoelectric conversion layer 30b may selectively absorb light in one of red, blue, or green wavelength regions. In some example embodiments, the second photoelectric device 100b may be a blue photoelectric device.

The upper insulation layer 80 may be formed on the second photoelectric device 100b. The lower insulation layer 60, the intermediate insulation layer 65, and the upper insulation layer 80 have a plurality of through-holes exposing the charge storages 55a, 55b, and 55c.

The third photoelectric device 100c is formed on the upper insulation layer 80. The third photoelectric device 100c includes a first electrode 10c and a second electrode 20c facing each other, and a photoelectric conversion layer 30c and a charge transport layer 40c disposed between the first electrode 10c and the second electrode 20c. The first electrode 10c, the second electrode 20c, the photoelectric conversion layer 30c, and the charge transport layer 40c are the same as described above, and the photoelectric conversion layer 30c may selectively absorb light in one of red, blue, or green wavelength regions. In some example embodiments, the third photoelectric device 100c may be a green photoelectric device and may be the photoelectric device 100.

Focusing lens (not shown) may be further formed on the third photoelectric device 100c. The focusing lens may control a direction of incident light and gather the light in one region. The focusing lens may have a shape of, in some example embodiments, a cylinder or a hemisphere, but is not limited thereto.

In the drawing, even though as the first photoelectric device 100a, the second photoelectric device 100b, and the third photoelectric device 100c, the photoelectric device 100 of FIG. 1 is for example illustrated, the photoelectric devices 100 of FIGS. 2 and 3 may be applied in the same manner.

In the drawing, the first photoelectric device 100a, the second photoelectric device 100b, and the third photoelectric device 100c are sequentially stacked, but the present disclosure is not limited thereto, and they may be stacked in various orders.

As described above, the first photoelectric device 100a, the second photoelectric device 100b, and the third photoelectric device 100c are stacked, and thus the size of an image sensor may be reduced to realize a down-sized image sensor.

Figure 13:
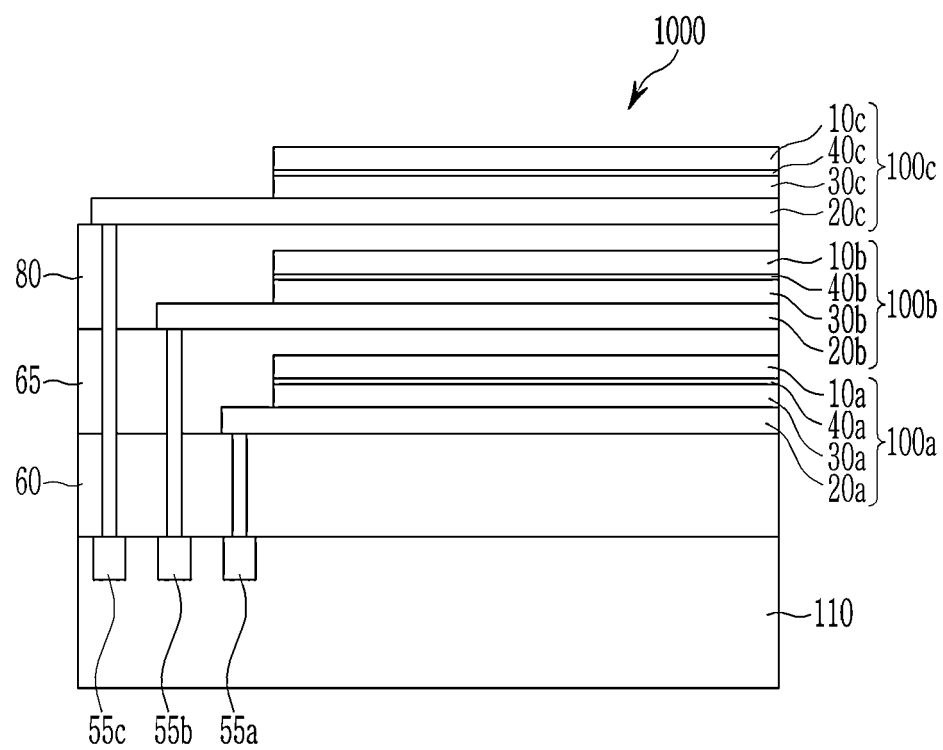
FIG. 13 is a cross-sectional view showing some example embodiments of an organic CMOS image sensor.

FIG. 13 is a cross-sectional view showing some example embodiments of an organic CMOS image sensor.

Referring to FIG. 13, an image sensor 1000 according to some example embodiments includes a semiconductor substrate 110, a lower insulation layer 60, an intermediate insulation layer 65, an upper insulation layer 80, a first photoelectric device 100a, a second photoelectric device 100b, and a third photoelectric device 100c, like the aforementioned example embodiments. However, the positions of the first electrode 10 and the second electrode 20 of the first photoelectric device 100a, the second photoelectric device 100b, and the third photoelectric device 100c are changed, in some example embodiments. That is, the first electrode 10 may be a light-receiving electrode.

The aforementioned photoelectric device and the image sensor may be applied to various electronic devices, for example a mobile phone or a digital camera, but are not limited thereto.

Hereinafter, some example embodiments are illustrated in more detail with reference to examples. However, the present scope is not limited to these example embodiments.

Example 1

A 150 nm-thick anode is formed by sputtering ITO on a glass substrate. Subsequently, a compound represented by Chemical Formula 3 is deposited on the anode to provide a 5 nm-thick charge auxiliary layer. Then, a p-type semiconductor 30-1 ($\Delta_{max}$: 545 nm, HOMO: 5.55 eV, LUMO: 3.54 eV) represented by Chemical Formula 4 and an n-type semiconductor 30-2 that is fullerene (C60, HOMO: 6.40 eV, LUMO: 4.23 eV) are co-deposited on the charge auxiliary layer in a volume ratio of 1:1 to provide a 100 nm-thick photoelectric conversion layer. Then, a compound represented by Chemical Formula 1-1 is deposited on the photoelectric conversion layer to form a 4 nm-thick first charge transport layer (HOMO: 6.12 eV, LUMO: 2.65 eV), and a compound represented by Chemical Formula 2-1 is deposited on the first charge transport layer to form a 1 nm-thick second charge transport layer (HOMO: 6.26 eV, LUMO: 2.68 eV) to form a total 5 nm-thick charge transport layer. Then, ITO (WF: 4.7 eV) is sputtered on the charge transport layer to provide a 7 nm-thick cathode. Then, aluminum oxide ($Al_2O_3$) is deposited on the cathode to provide a 50 nm-thick anti-reflection layer and sealed with a glass plate to provide a photoelectric device.

[Chemical Formula 1-1]

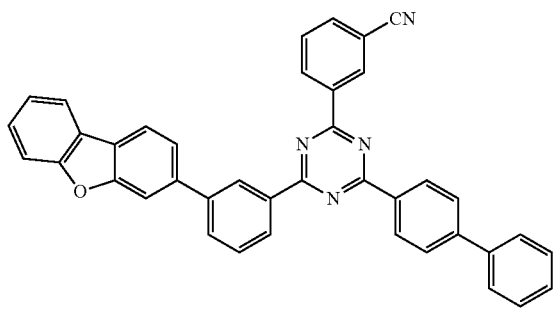

[Chemical Formula 2-1]

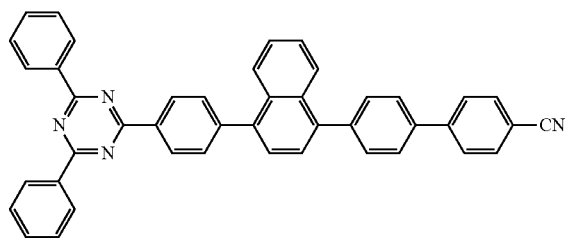

[Chemical Formula 3]

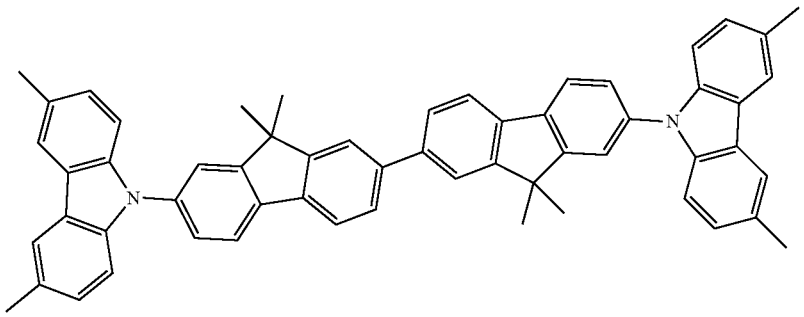

[Chemical Formula 4]

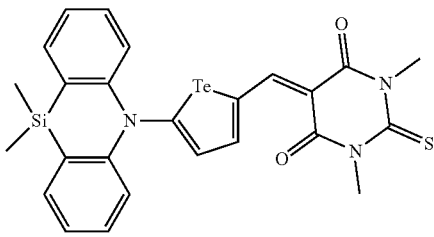

Example 2

A photoelectric device is manufactured according to the same method as Example 1 except that a 3 nm-thick first charge transport layer and a 2 nm-thick second charge transport layer are formed.

Example 3

A photoelectric device is manufactured according to the same method as Example 1 except that a 2 nm-thick first charge transport layer a 3 nm-thick second charge transport layer are formed.

Comparative Example 1

A photoelectric device is manufactured according to the same method as Example 1 except that the first and second charge transport layers are not formed.

Comparative Example 2

A photoelectric device is manufactured according to the same method as Example 1 except that a 5 nm-thick single charge transport layer is formed instead of the first and second charge transport layers by depositing a compound represented by Chemical Formula 1-1 on the photoelectric conversion layer.

Comparative Example 3

A photoelectric device is manufactured according to the same method as Example 1 except that a 5 nm-thick single charge transport layer is formed instead of the first and second charge transport layers by depositing a compound represented by Chemical Formula 2-1 on the photoelectric conversion layer.

Evaluation I

Remaining electron characteristics of the photoelectric devices according to Examples and Comparative Examples are evaluated.

The remaining electron characteristics are evaluated by measuring an amount of charges photoelectrically converted in one frame but not signal-treated and remaining and thus read in the next frame and specifically, heat-treating the photoelectric devices of Examples and Comparative Examples at 180° C. for 3 hours, irradiating them with light of a wavelength region where a photoelectric conversion occurs (e.g., light in a green wavelength region) for predetermined time, turning the light off, and then, measuring a current amount obtained by a unit of $10^{-6}$ seconds with a Keithley 2400 equipment.

The results are shown in Tables 1 and 2.

TABLE 1

|  | Remaining electrons (e⁻) 68 lux |
|---|---|
| Example 1 | 3.95 |
| Example 3 | 3.73 |
| Comparative Example 1 | 4.94 |
| Comparative Example 2 | 8.13 |
| Comparative Example 3 | 99.2 |

TABLE 2

|  | Remaining electrons (e⁻) 5,000 lux |
|---|---|
| Example 1 | 115 |
| Example 2 | 153 |
| Example 3 | 169 |
| Comparative Example 3 | 5556 |

Referring to Tables 1 and 2, the photoelectric devices of Examples exhibit improved remaining electron characteristics compared with those of Comparative Examples.

Evaluation II

Photoelectric conversion efficiency of Examples and Comparative Examples are evaluated.

The photoelectric conversion efficiency (EQE) is evaluated in an Incident Photon to Current Efficiency (IPCE) method in a wavelength region of 400 nm to 720 nm.

Figure 14:
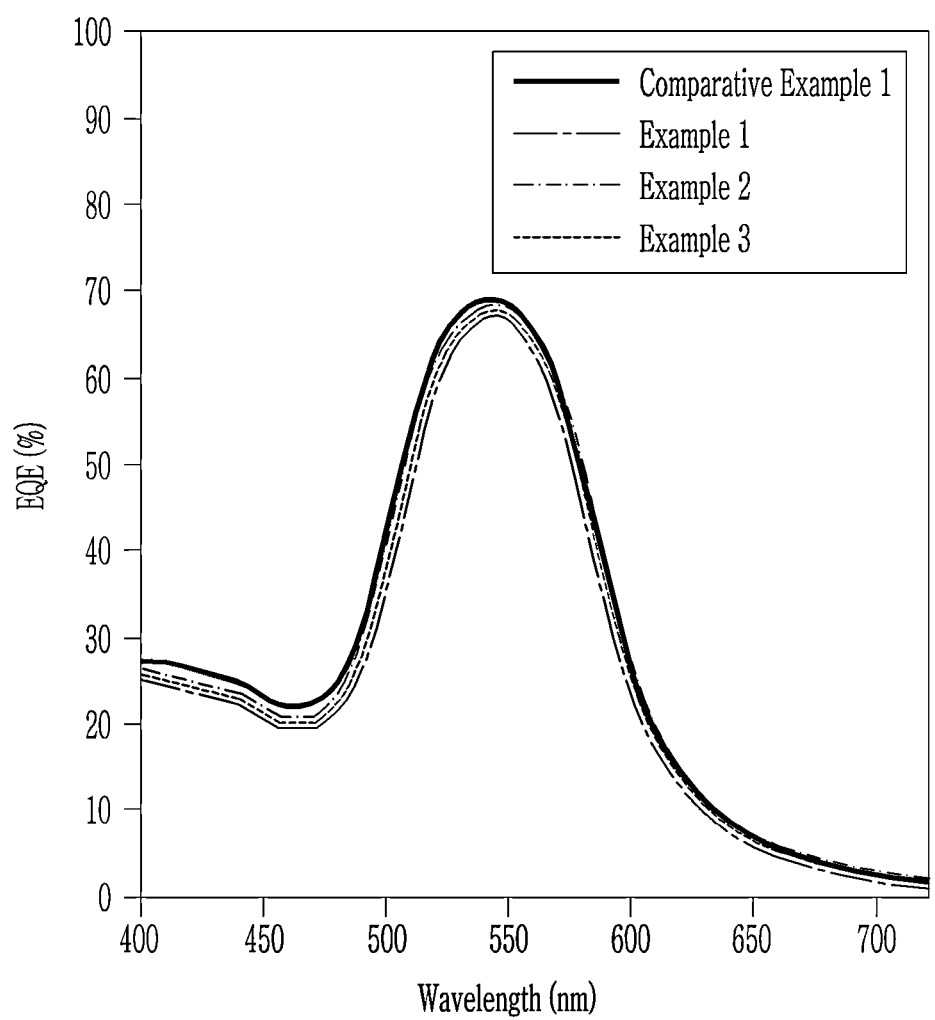
FIG. 14 is a graph showing the photoelectric conversion efficiency (EQE) depending on a wavelength of the photoelectric devices according to Comparative Example and Examples 1 to 3.

The results are shown in FIG. 14.

FIG. 14 is a graph showing the photoelectric conversion efficiency for the photoelectric devices according to Examples 1 to 3 and Comparative Example 1.

Referring to FIG. 14, the photoelectric devices of Examples exhibit equivalent photoelectric conversion efficiency with those of the photoelectric devices of Comparative Examples. Accordingly, the photoelectric devices of Examples exhibit improved remaining electron characteristics without a substantial photoelectric conversion efficiency decrease compared with the photoelectric devices of Comparative Examples.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

DESCRIPTION OF SYMBOLS 10, 10a, 10b, 10c: first electrode
20, 20a, 20b, 20c: second electrode
30, 30a, 30b, 30c: photoelectric conversion layer
30-1: p-type semiconductor
30-2: n-type semiconductor
30j: pn junction
40, 40a, 40b, 40c: charge transport layer
40-1: first charge transport material
40-2: second charge transport material
40h: heterojunction
40i: interface
40t: thickness of charge transport layer
41: second charge transport layer
41t: thickness of second charge transport layer
43: first charge transport layer
43t: thickness of first charge transport layer
45: charge auxiliary layer
50a, 50b, 50c: photo-sensing device
60: lower insulation layer
70: color filter layer
80: upper insulation layer
85: through-hole
100: photoelectric device
110: semiconductor substrate
300, 400, 500, 600, 700, 800, 900, 1000: image sensor

What is claimed is:

1. A thin film for a photoelectric device, the thin film comprising:
a first charge transport material and a second charge transport material that collectively define a heterojunction,
wherein the thin film is configured to facilitate transfer of charge carriers that are separated in a photoelectric conversion layer of the photoelectric device to reduce a quantity of remaining charge carriers in the photoelectric conversion layer, and
wherein the first charge transport material and the second charge transport material are mixed, and
wherein the first charge transport material and the second charge transport material have a same nitrogen-containing ring.

2. The thin film of claim 1, wherein a difference between a Lowest Unoccupied Molecular Orbital (LUMO) energy level of the first charge transport material and a LUMO energy level of the second charge transport material is less than or equal to about 0.05 eV.

3. The thin film of claim 1, wherein each material of the first charge transport material and the second charge transport material is a non-absorbing material.

4. The thin film of claim 1, wherein
the first charge transport material and the second charge transport material are organic materials having different structures, and
the first charge transport material and the second charge transport material have the same nitrogen-containing ring and a same cyano group.

5. The thin film of claim 1, wherein the thin film has a thickness of less than or equal to about 10 nm.

6. A photoelectric device comprising: the thin film of claim 1.

7. The photoelectric device of claim 6, wherein
the photoelectric device includes a photoelectric conversion layer configured to absorb light in a wavelength spectrum and convert the absorbed light into an electrical signal, the photoelectric conversion layer including a p-type semiconductor and an n-type semiconductor which collectively define a pn junction,
a difference between a Lowest Unoccupied Molecular Orbital (LUMO) energy level of the first charge transport material and a LUMO energy level of the second charge transport material is less than or equal to about 0.05 eV,
a difference between a LUMO energy level of the n-type semiconductor and the LUMO energy level of the first charge transport material is greater than or equal to about 1.2 eV, and
a difference between the LUMO energy level of the n-type semiconductor and the LUMO energy level of the second charge transport material is greater than or equal to about 1.2 eV.

8. The photoelectric device of claim 6, wherein
the photoelectric device includes a photoelectric conversion layer configured to absorb light in a wavelength spectrum and convert the absorbed light into an electrical signal,
the thin film includes
a first charge transport layer including the first charge transport material, and
a second charge transport layer including the second charge transport material,
the first charge transport layer and the second charge transport layer are in contact with each other,
a Lowest Unoccupied Molecular Orbital (LUMO) energy level of the first charge transport material is shallower than a LUMO energy level of the second charge transport material, and
the first charge transport layer is closer to the photoelectric conversion layer than the second charge transport layer.

9. A sensor comprising the photoelectric device of claim 6.

10. An electronic device comprising the sensor of claim 9.

11. An electronic device comprising the photoelectric device of claim 6.

12. A thin film for a photoelectric device, the thin film comprising:
a first charge transport material and a second charge transport material that collectively define a heterojunction,
wherein the thin film is configured to facilitate transfer of charge carriers that are separated in a photoelectric conversion layer of the photoelectric device to reduce a quantity of remaining charge carriers in the photoelectric conversion layer, and wherein the thin film is configured to have a positive charge at an interface of the first charge transport material and the second charge transport material in response to application of an electrical field to the thin film.

13. The thin film of claim 12, wherein the first charge transport material is represented by Chemical Formula 1:

[Chemical Formula 1]

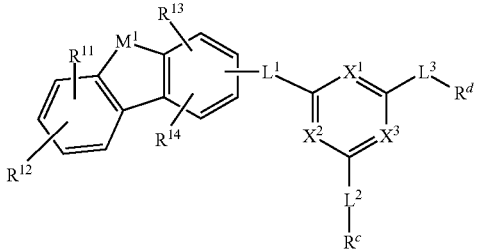

wherein, in Chemical Formula 1,
$X^1$ to $X^3$ are independently $CR^a$ or N,
at least two of $X^1$ to $X^3$ are N,
$M^1$ is O, S, Se, Te, or $NR^b$,
$R^a$ and $R^b$ are independently hydrogen, a substituted or unsubstituted C1 to C30 alkyl group, or a substituted or unsubstituted C6 to C30 aryl group,
$R^c$ and $R^d$ are a substituted or unsubstituted C6 to C30 aryl group, a substituted or unsubstituted C3 to C30 heterocyclic group, or a cyano group,
$L^1$ to $L^3$ are independently a single bond, a substituted or unsubstituted C1 to C6 alkylene group, a substituted or unsubstituted C6 to C30 arylene group, or a combination thereof, and
$R^{11}$ to $R^{14}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

14. The thin film of claim 13, wherein
$X^1$ to $X^3$ are independently N,
$M^1$ is O or S,
$L^1$ to $L^3$ are independently a single bond or a substituted or unsubstituted C6 to C30 arylene group,
$R^c$ and $R^d$ are a substituted or unsubstituted C6 to C30 aryl group, or a cyano group, and
$R^{11}$ to $R^{14}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

15. The thin film of claim 12, wherein the second charge transport material is represented by Chemical Formula 2:

[Chemical Formula 2]

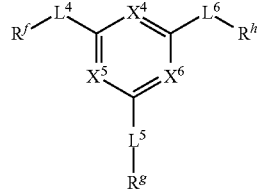

wherein, in Chemical Formula 2,
$X^4$ to $X^6$ are independently $CR^e$ or N,
at least two of $X^4$ to $X^6$ are N,
$R^e$ is hydrogen, a substituted or unsubstituted C1 to C30 alkyl group, or a substituted or unsubstituted C6 to C30 aryl group,
$R^f$ to $R^h$ are a substituted or unsubstituted C6 to C30 aryl group, a substituted or unsubstituted C3 to C30 heterocyclic group, or a cyano group, and
$L^4$ to $L^6$ are independently a single bond, a substituted or unsubstituted C1 to C6 alkylene group, a substituted or unsubstituted C6 to C30 arylene group, or a combination thereof.

16. The thin film of claim 15, wherein
$X^4$ to $X^6$ are independently N, and
$L^4$ to $L^6$ are independently a single bond or a substituted or unsubstituted C6 to C30 arylene group.

17. The thin film of claim 12, wherein the thin film includes
a first charge transport layer including the first charge transport material, and
a second charge transport layer including the second charge transport material.

18. The thin film of claim 17, wherein the first charge transport layer and the second charge transport layer are in contact with each other.

19. The thin film of claim 18, wherein each thickness of the first charge transport layer and the second charge transport layer is less than or equal to about 5 nm.

20. A thin film for a photoelectric device, the thin film comprising:
a first charge transport material and a second charge transport material that collectively define a heterojunction,
wherein the thin film is configured to facilitate transfer of charge carriers that are separated in a photoelectric conversion layer of the photoelectric device to reduce a quantity of remaining charge carriers in the photoelectric conversion layer, and
wherein a difference between an energy bandgap of the first charge transport material and an energy bandgap of the second charge transport material is greater than about 0 eV and less than or equal to about 0.2 eV.

* * * * *